(12) United States Patent
Meng

(10) Patent No.: US 9,964,287 B2
(45) Date of Patent: May 8, 2018

(54) LED SUPPORT, LED AND BACKLIGHT MODULE

(71) Applicants: BOE TECHNOLOGY GROUP CO., LTD., Beijing (CN); BEIJING BOE CHATANI ELECTRONICS CO., LTD., Beijing (CN)

(72) Inventor: Yingli Meng, Beijing (CN)

(73) Assignees: BOE TECHNOLOGY GROUP CO., LTD., Beijing (CN); BEIJING BOE CHATANI ELECTRONICS CO., LTD., Beijing (CN)

( * ) Notice: Subject to any disclaimer, the term of this patent is extended or adjusted under 35 U.S.C. 154(b) by 168 days.

(21) Appl. No.: 14/421,524

(22) PCT Filed: Apr. 25, 2014

(86) PCT No.: PCT/CN2014/076266
§ 371 (c)(1),
(2) Date: Feb. 13, 2015

(87) PCT Pub. No.: WO2015/000331
PCT Pub. Date: Jan. 8, 2015

(65) Prior Publication Data
US 2015/0192278 A1    Jul. 9, 2015

(30) Foreign Application Priority Data

Jul. 4, 2013 (CN) .................. 2013 2 0396703 U

(51) Int. Cl.
*F21V 15/01* (2006.01)
*F21V 7/00* (2006.01)
(Continued)

(52) U.S. Cl.
CPC ................ *F21V 15/01* (2013.01); *F21V 7/00* (2013.01); *F21V 19/0025* (2013.01);
(Continued)

(58) Field of Classification Search
CPC ... G02B 6/0073; G02B 6/0078; H01L 33/486; H01L 33/58; H01L 33/60;
(Continued)

(56) References Cited

U.S. PATENT DOCUMENTS 5,428,912 A * 7/1995 Grondal ............... G02B 6/0055
362/800
6,627,922 B1 * 9/2003 Ishinaga ............... H01L 33/486
257/100
(Continued)

FOREIGN PATENT DOCUMENTS

| CN | 1996122 A | 7/2007 |
|---|---|---|
| CN | 101029710 A | 9/2007 |
| CN | 203312365 U | 11/2013 |

OTHER PUBLICATIONS

PCT International Search Report for application No. PCT/CN2014/076266.

*Primary Examiner* — Alan Cariaso
(74) *Attorney, Agent, or Firm* — Nath, Goldberg & Meyer; Joshua B. Goldberg

(57) ABSTRACT

The invention discloses a LED support comprising an opaque housing. A mounting face for placing at least one LED chip is provided inside the housing. At least two light-exiting windows are provided on the housing so as to allow light emitted from the LED chip to emit outwards from the housing therethrough. The LED support enables a LED assembled with the LED support to emit light from at least two sides, thus light-emitting angle of LED is enlarged, and thereby application range of LED is widened. Meanwhile, with such LED support, the number of the light-exiting windows of the LED comprising the LED support is increased, thus the times by which light from the LED chip (Continued)

mounted on the LED support is reflected inside the LED support is decreased, and thereby light emission efficiency is improved significantly.

17 Claims, 3 Drawing Sheets

(51) Int. Cl.
*F21V 8/00* (2006.01)
*F21V 19/00* (2006.01)
*H01L 33/58* (2010.01)
*H01L 33/48* (2010.01)
*H01L 33/60* (2010.01)

(52) U.S. Cl.
CPC ......... *G02B 6/0073* (2013.01); *G02B 6/0078* (2013.01); *H01L 33/486* (2013.01); *H01L 33/58* (2013.01); *H01L 33/60* (2013.01); *H01L 2224/45144* (2013.01); *H01L 2224/48091* (2013.01)

(58) Field of Classification Search
CPC ....... H01L 224/45144; H01L 224/4809; F21V 15/01; F21V 7/00; F21V 19/0025
USPC .............................................. 40/572; 257/99
See application file for complete search history.

(56) References Cited

U.S. PATENT DOCUMENTS

| | | | | |
|---|---|---|---|---|
| 6,661,084 B1 * | 12/2003 | Peterson | ............... | B81B 7/0067 257/680 |
| 6,919,586 B2 * | 7/2005 | Fujii | .................... | H01L 33/486 257/100 |
| 7,157,853 B2 * | 1/2007 | Lmai | .................... | G02B 6/0028 257/E33.059 |
| 7,293,908 B2 * | 11/2007 | Beeson | ............. | G02F 1/133603 257/290 |
| 7,915,623 B2 * | 3/2011 | Yamamoto | ................. | B41J 2/45 257/79 |
| 7,977,698 B2 * | 7/2011 | Ling | ........................ | G09F 9/33 257/100 |
| 8,030,674 B2 * | 10/2011 | Hsu | ........................ | H01L 33/60 257/676 |
| 8,823,040 B2 * | 9/2014 | Takeda | .................. | H01L 33/486 257/100 |
| 2003/0141813 A1 * | 7/2003 | Miyashita | ............ | H01L 33/486 313/512 |
| 2006/0191179 A1 * | 8/2006 | Gonzalez | .................. | G09F 1/12 40/572 |
| 2007/0138496 A1 * | 6/2007 | Zhao | ..................... | G02B 6/0073 257/98 |
| 2012/0051041 A1 * | 3/2012 | Edmond | ................. | F21S 8/026 362/231 |

* cited by examiner

LED SUPPORT, LED AND BACKLIGHT MODULE

This is a National Phase Application filed under 35 U.S.C. 371 as a national stage of PCT/CN2014/076266, filed Apr. 25, 2014, an application claiming the benefit to Chinese Application No. 201320396703.1, filed Jul. 4, 2013; the content of each of which is hereby incorporated by reference in its entirety.

FIELD OF THE INVENTION

The present invention relates to the technical field of LED application, and particularly to a LED support, a LED comprising the LED support, and a backlight module.

BACKGROUND OF THE INVENTION

With increasing shortage of the conventional energy and deterioration of the environment on the earth, in the field of illumination, lighting devices with low power consumption and high environmental protection performance are more desired. LED (Light-Emitting Diode), as a light-emitting source, has characteristics of long lifespan, high brightness, low power consumption, no ultraviolet and infrared radiation, low heat generation, and so on. Since LED has notable effect in energy saving and can meet the current development demands of low-carbon, green and environmental protection, LED is widely used in the field of illumination, such as LED lighting, LED backlight, and the like.

As shown in FIG. 1, a conventional LED 11 comprises a LED support 6, a LED chip 1, electrodes 4, gold wires 2 and lead wires 3. In addition, the LED support 6 comprises an opaque housing 7, which is provided with a light-exiting window 5 allowing light emitted from the LED chip 1 to exit outwards. The LED chip 1 and the electrodes 4 are located inside the housing 7, and the LED chip 1 is connected to the electrodes by the gold wires 2. The lead wires 3 are provided outside the housing 7. The electrodes 4 inside the housing 7 are connected with the lead wires 3 outside the housing 7 so as to be connected to external circuits through the lead wires 3. Because the LED 11 emits light from a single side, light-emitting angle of the LED 11 is limited, which limits application of the LED 11. For example, in billboards lighting, home decoration, and other places, in order to enhance decorative effect, light-emitting angle should be enlarged, but the LED 11 emitting light from a single side cannot meet such need. In addition, light emitted from P/N junction region of the LED chip 1 in LED is non-directional. Single-sided light emission causes most light to be reflected and absorbed many times, thus light emission efficiency is reduced.

In the present market, double-sided light emission is realized usually by doubling the number of the single-sided LED(s) so as to place a single-sided LED in each of two directions. With such method, the number of used LEDs is increased, thereby the cost is increased. Moreover, in a LED lighting device manufactured by using such method, heat dissipation is adversely affected, and service life of the LED is reduced.

SUMMARY OF THE INVENTION

In view of the above disadvantages, the present invention provides a LED support, a LED comprising the LED support, and a backlight module, in which the LED assembled with the LED support can emit light from at least two sides, thus light-emitting angle of the LED is enlarged, and thereby application range of the LED is widened.

A technical solution for solving the above problem is a LED support comprising: an opaque housing, a mounting face for placing at least one LED chip being provided inside the housing, wherein at least two light-exiting windows are provided on the housing so as to allow light emitted from the LED chip to exit outwards from the housing through the at least two light-exiting windows.

Preferably, the housing is provided with two light-exiting windows, and the two light-exiting windows are disposed opposite to each other on the housing.

Preferably, the mounting face inside the housing is disposed to face an inner wall of the housing on which no light-exiting window is provided.

Preferably, a light-reflecting layer is provided on a surface of an inner wall of the housing.

Preferably, the LED support further comprises a pad, which is disposed on the mounting face inside the housing and is used for fixing the LED chip to the mounting face.

Preferably, the LED support further comprises an electrode, which is disposed on an inner wall of the housing and is electrically connected with the LED chip.

Preferably, the LED support further comprises a pin, which is disposed outside the housing and is electrically connected with the electrode.

The invention further provides a LED, which comprises at least one LED chip, and further comprises the above LED support, wherein the LED chip is disposed on the mounting face.

Preferably, the LED comprises a plurality of the LED chips, and the plurality of the LED chips are arranged in an array of LED chips.

The invention further provides a backlight module comprising at least one LED as described above.

Preferably, the backlight module further comprises at least two light guide mechanisms, wherein the at least one LED is disposed between side faces of any two adjacent light guide mechanisms, and two light-exiting windows from the light-exiting windows of each LED correspond to the side faces of the two adjacent light guide mechanisms, respectively.

REFERENCE NUMERALS

1—LED chip; 2—gold wire; 3—lead wire; 4—electrode; 5—light-exiting window; 6—LED support; 7—housing; 8—recess; 9—mounting face; 10—fluoresent material;

11—LED; 12—barrier sheet; 13—protrusion; 14—backboard; 15—light guide plate; 16—side face of light guide plate.

DETAILED DESCRIPTION OF THE EMBODIMENTS

In order that a person skilled in the art can fully understand the technical solutions of the invention, the invention will be described in detail below in conjunction with the accompanying drawings as well as specific embodiments.

First Embodiment

Figure 1:
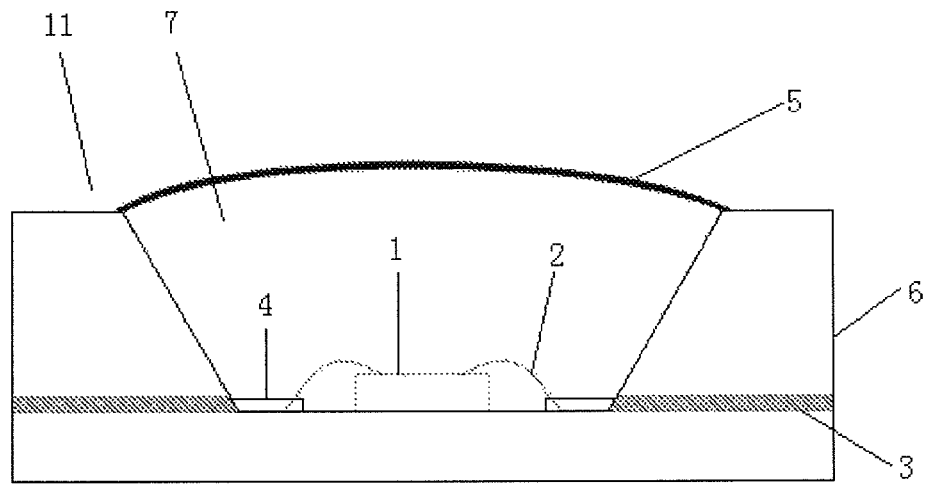
FIG. 1 is a schematic diagram of a structure of a LED in the prior art.
Figure 2:
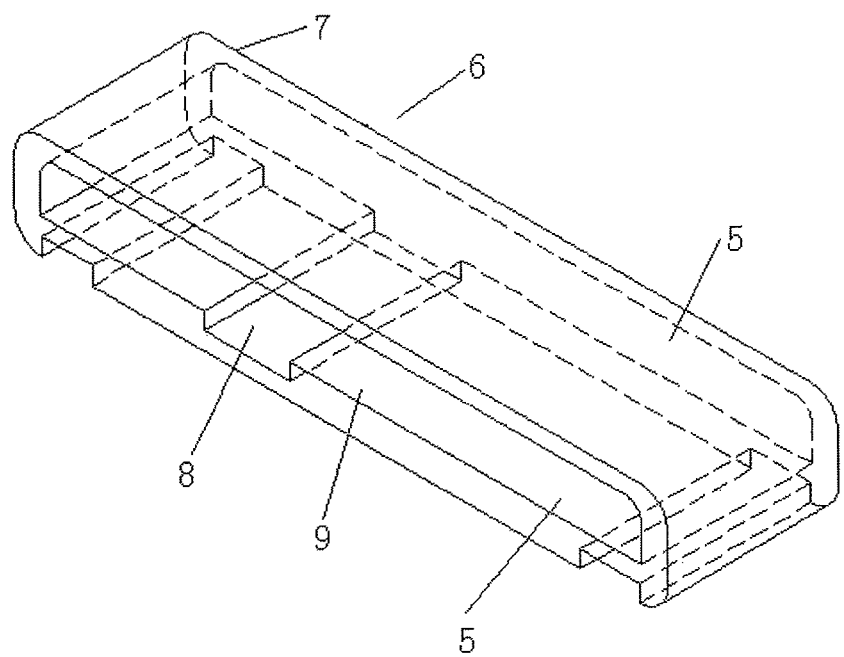
FIG. 2 is a perspective view of an exemplary structure of a LED support in a first embodiment of the invention.
Figure 3:
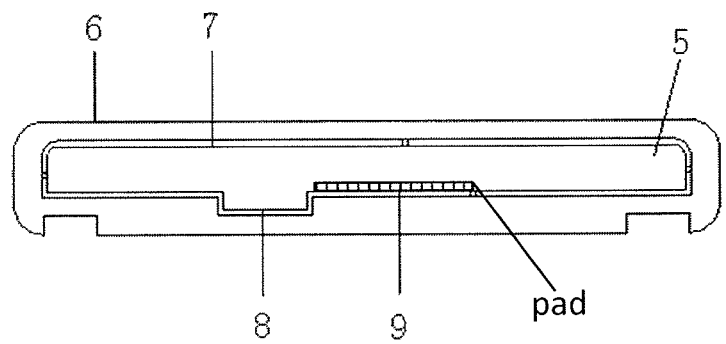
FIG. 3 is a cross sectional view of the LED support in the first embodiment of the invention.
Figure 4:
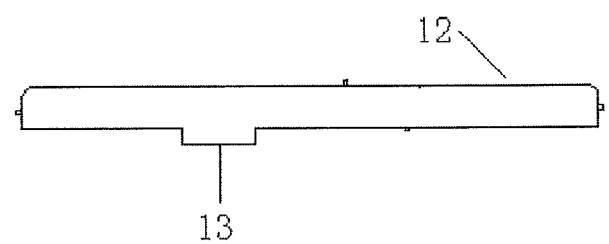
FIG. 4 is a front view of a barrier sheet used in a potting sealant process during assembling of LED by using the LED support in the first embodiment of the invention.

As shown in FIGS. 2 to 4, the present embodiment provides a LED support 6 which comprises an opaque housing 7. A mounting face 9 for disposing at least one LED chip 1 thereon is provided inside the housing 7. According to the present invention, at least two light-exiting windows 5 are provided on the housing 7 so that light emitted from the LED chip 1 is allowed to exit outwards from the housing 7 through the at least two light-exiting windows 5.

In the present embodiment, two light-exiting windows 5 are provided on the housing 7 of the LED support 6. Obviously, in other embodiments, more than two light-exiting windows 5 may be provided on the housing 7 of the LED support 6.

With the LED support 6 in the present embodiment, a LED 11 assembled with the support can emit light from two sides, thus light-emitting angle of the LED 11 is enlarged, and application range of the LED 11 is widened. Meanwhile, with such LED support 6, the number of the light-exiting windows 5 of the LED 11 assembled with the LED support is increased, thus the times by which light emitted from the LED chip 1 mounted on the LED support 6 is reflected inside the LED support 6 is decreased, and thereby light emission efficiency is improved significantly.

Light emitted from the LED chip 1 is non-directional light. If only one light-exiting window 5 is provided on the housing 7 of the LED support 6, most light emitted by the LED chip 1 will be finally emitted out from the light-exiting window of the housing 7 after being reflected and absorbed many times inside the housing 7 of the LED support 6. If at least two light-exiting windows 5 are provided on the housing 7 of the LED support 6, the times by which light emitted by the LED chip 1 mounted inside the LED support 6 is reflected inside the housing 7 is greatly decreased, and thus optical path is shortened. Probability that non-directional light emitted by the LED chip 1 is emitted from the housing 7 may be improved significantly, and thereby light emission efficiency of light emitted by the LED chip 1 may be improved.

Preferably, the two light-exiting windows 5 provided on the housing 7 of the LED support 6 are disposed opposite to each other on the housing 7. In the case that the two light-exiting windows 5 are disposed on two opposite sides of the housing 7 respectively, light emitted from the housing 7 is symmetrically distributed, thus uniformity of light emitted by the LED 11, as a light source, assembled with the support 6.

Preferably, the mounting face 9 is inside the housing 7 and disposed to face an inner wall of the housing 7 on which no light-exiting window 5 is provided. When the LED 11 is assembled with the LED support 6, the LED chip 1 is mounted on the mounting face 9. Since the mounting face 9 is inside the housing 7 and disposed to face the inner wall of the housing 7 on which no light-exiting window 5 is provided, i.e., light-emitting face of the LED chip 1 faces the inner wall of the housing 7 on which no light-exiting window 5 is provided, not all of light emitted from the LED chip 1 is emitted directly from inside of the housing 7. Most light is first reflected and mixed to some extent inside the housing 7, and then exits from the light-exiting windows 5 of the housing 7. Thus, uniformity of light emitted from the LED 11 is improved.

Preferably, a light-reflecting layer is provided on a surface of an inner wall of the housing 7. Since light emitted from the LED chip 1 is irradiated in a fan shape, the two light-exiting windows 5 provided on the housing 7 may generally not cover the whole fan-shaped irradiation region corresponding to light emitted from the LED chip 1. Thus, by providing the light-reflecting layer on the surface of the inner wall of the housing 7, energy loss during transmission of light emitted from the LED chip 1 inside the housing 7 may be reduced.

Preferably, the LED support 6 further comprises a pad, which is disposed on the mounding face 9 inside the housing 7. The pad is used for fixing the LED chip 1 on the mounding face 9. The LED chip 1 can be stably fixed inside the housing 7 of the LED support 6 by the pad, so that electrical connection of the LED chip 1 can be effectively implemented.

Figure 5:
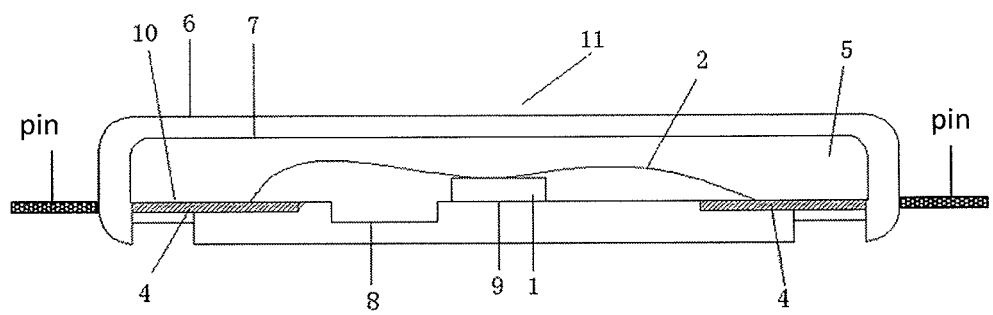
FIG. 5 is a schematic diagram of a structure of a LED in a third embodiment of the invention.

As shown in FIG. 5, preferably, the LED support 6 further comprises an electrode 4. The electrode 4 is disposed on an inner wall of the housing 7 so as to be electrically connected to the LED chip 1. More preferably, the electrode 4 is disposed on the inner wall of the housing 7 on which the LED chip 1 is mounted. The LED chip 1 is connected to the electrode 4 by using a bonding wire so that a circuit connection is formed between the LED chip 1 and the electrode 4. A gold wire 2 is used as the bonding wire in the present embodiment. The reason of using the gold wire 2 is that the gold wire 2 has good resistance to stress and good heat dissipation. Then, fluorescent material 10 is provided on the LED chip 1. Next, glue is provided on the LED chip 1 and the gold wire 2 in order to protect the LED chip 1 and the gold wire 2. Next, baking is performed, and sealing is performed by potting sealant process.

As shown in FIGS. 2 to 4, the housing 7 of the LED support 6 in the present embodiment comprises two light-exiting windows 5. When encapsulating sealant is poured by potting sealant process, a barrier sheet 12 needs to be placed inside the housing 7 so as to separate the two light-exiting windows 5 of the housing 7, and the two separated parts of the housing 7 are not intercommunicated. First, encapsulating sealant is poured into one part of the housing 7 separated by the barrier sheet 12. After pouring sealant is finished and the encapsulating sealant is cured, the barrier sheet 12 is removed, and then encapsulating sealant is poured into the other part of the housing 7. After the encapsulating sealant is cured, encapsulation of the LED chip 1 in the housing 7 of the LED support 6 is finished, and LED 11 is finally obtained. A recess 8 is provided in the housing 7 of the LED support 6. The recess 8 is used to support the barrier sheet 12 in pouring sealant. The barrier sheet 12 has a protrusion 13 used for matching the recess 8, so that the barrier sheet 12 can stand stably in the housing 7. In the present embodiment, the mounting face 9 for the LED chip 1 may be disposed at the center of a bottom face of the housing 7, and the recess 8 may be disposed near the mounting face 9 for the LED chip 1 inside the housing 7.

Preferably, the LED support 6 further comprises a pin. The pin is disposed outside the housing 7 and electrically connected to the electrode 4. The LED 11 assembled with the LED support 6 may be electrically connected to an external circuit board via the pin.

Second Embodiment

The present embodiment differs from the first embodiment in that, three light-exiting windows 5 are provided on the housing 7 of the LED support 6 so that light emitted from the LED chip 1 may be emitted outside of the housing 7 through the three light-exiting windows 5. For example, on each of three sides of the housing 7 of the LED support 6 having a substantially cuboid structure, one light-exiting window 5 is provided. Preferably, one light-exiting window 5 may be provided on each of three sides of the housing 7 other than the side facing the mounting face on which the LED chip 1 is mounted.

The LED support 6 may be used in a light which is required to emit light from three sides, such as a landscape decorative light. Since the LED 11 assembled with the LED support 6 can emit light from three sides, it reduces power consumption significantly, has good heat dissipation and reduced volume, compared with an ordinary light which is formed by combining three LEDs 11.

Third Embodiment

As shown in FIG. 5, the present embodiment provides a LED 11, which comprises at least one LED chip 1 and further comprises the LED support 6 in the above first embodiment or the second embodiment. The LED chip 1 is disposed on the mounting face 9 inside the housing 7 of the LED support 6.

Preferably, the LED 11 comprises a plurality of the LED chips 1. The plurality of the LED chips 1 are arranged in an array of LED chips. This array of LED chips can enhance intensity of light emitted by the LED 11.

Preferably, the LED 11 further comprises encapsulating sealant for encapsulating the LED chips 1 in the housing 7.

Fourth Embodiment

Figure 6:
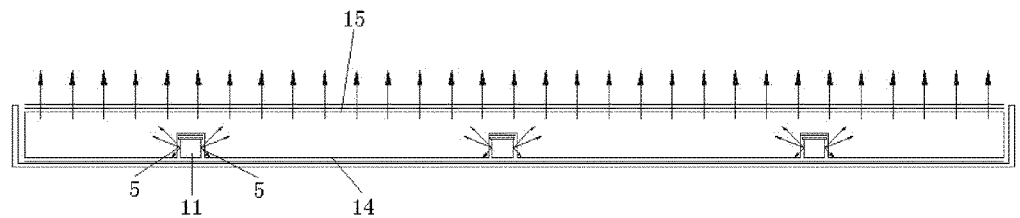
FIG. 6 is a schematic diagram of a structure of a backlight module in a fourth embodiment of the invention.

As shown in FIG. 6, the present embodiment provides a backlight module comprising at least one LED 11 in the third embodiment. The backlight module in the present embodiment is a direct-light-type backlight module. The LEDs 11 are arranged on the back board 14 evenly. A light guide plate 15, a diffusion plate, a diffusion film and a prism film are provided above the LEDs 11 with a certain distance from the LEDs 11. Light emitted from the LED chip 1 in each LED 11 is emitted outwards from respective light-exiting windows 5, then emitted outside of the backlight module through the light guide plate 15, the diffusion plate, the diffusion film, the prism film and so on, and thus an uniform light-emitting surface without light shadow is formed.

Fifth Embodiment

Figure 7:
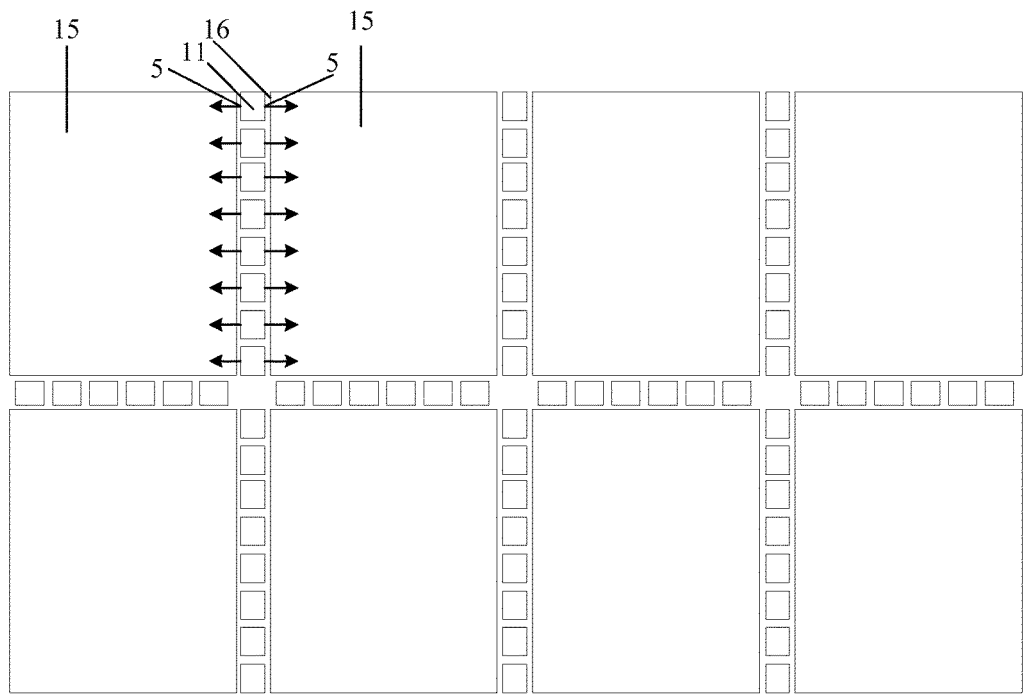
FIG. 7 is a schematic diagram of a structure of a backlight module in a fifth embodiment of the invention.

As shown in FIG. 7, the present embodiment provides a backlight module comprising at least two light guide mechanisms. The LED 11 in the third embodiment is disposed between side faces of any two adjacent light guide mechanisms. Two light-exiting windows 5 from the light-exiting windows 5 of the LED 11 correspond to the side faces of the adjacent light guide mechanisms, respectively.

In the present embodiment, as shown in FIG. 7, the light guide mechanism comprises a light guide plate. Each LED 11 has two light-exiting windows 5 opposite to each other. The two light-exiting windows 5 correspond to respective side faces 16 of the two adjacent light guide mechanisms 15 respectively. Since the LED 11 can emit light from at least two sides, one LED 11 can be used as a light source for two adjacent light guide mechanisms at the same time. A large sized backlight module may be formed by connecting a plurality of middle sized light guide mechanisms together. The LED 11 provides light to the light guide plate 15 from the side face 16 of the light guide plate 15, which can reduce thickness of the whole backlight module and can also reduce power consumption of the whole backlight module. Therefore, the backlight module is suitable to be used in a large sized backlight module.

Other known components such as a diffusion plate, a diffusion film and a prism film may also be provided on the LEDs 11 and the light guide mechanisms. Since the LED 11 has small volume, and light is emitted to outside by a same LED 11, light emitted by the LED 11 may be mixed uniformly in the whole backlight module, and thus, line-shaped shadow between two light guide mechanisms can be avoided.

It can be understood that the above embodiments are only exemplary embodiments for illustrating the principle of the present invention; however, the present invention is not limited thereto. As for a person skilled in the art, various variations and improvements can be made without departing from the spirit and essence of the present invention, and these variations and improvements should be considered to be within the protection scope of the present invention.

The invention claimed is:

1. A LED support, comprising an opaque housing, a mounting face for placing at least one LED chip being provided inside the housing, and an electrode disposed on an inner wall of the housing and electrically connected with the LED chip,
   wherein the housing has only two light-exiting window disposed on two opposite side surfaces of the housing so as to allow light emitted from the LED chip to exit outwards from the housing through the two light-exiting window, wherein the mounting face is provided on a bottom surface of the housing, and the electrode is embedded in the housing so as to not protrude from the bottom surface of the housing.

2. The LED support of claim 1, wherein the mounting face inside the housing is disposed to face an inner wall of the housing on which no light-exiting window is provided.

3. The LED support of claim 1, wherein a light-reflecting layer is provided on a surface of an inner wall of the housing.

4. The LED support of claim 1, further comprising a pad, which is disposed on the mounting face inside the housing and is used for fixing the LED chip to the mounting face.

5. The LED support of claim 1, further comprising a pin, which is disposed outside the housing and is electrically connected with the electrode.

6. A LED, comprising at least one LED chip, wherein, the LED further comprises the LED support of claim 1, and the LED chip is disposed on the mounting face.

7. The LED of claim 6, wherein the mounting face inside the housing is disposed to face an inner wall of the housing on which no light-exiting window is provided.

8. The LED of claim 7, wherein the LED comprises a plurality of the LED chips, and the plurality of the LED chips are arranged in an array of LED chips.

9. The LED of claim 6, wherein a light-reflecting layer is provided on a surface of an inner wall of the housing.

10. The LED of claim 9, wherein the LED comprises a plurality of the LED chips, and the plurality of the LED chips are arranged in an array of LED chips.

11. The LED of claim 6, wherein the LED support further comprises a pad, which is disposed on the mounting face inside the housing and is used for fixing the LED chip to the mounting face.

12. The LED of claim 6, wherein the LED support further comprises an electrode which is disposed on an inner wall of the housing and is electrically connected with the LED chip.

13. The LED of claim 12, wherein the LED support further comprises a pin, which is disposed outside the housing and is electrically connected with the electrode.

14. The LED of claim 6, wherein the LED comprises a plurality of the LED chips, and the plurality of the LED chips are arranged in an array of LED chips.

15. A backlight module, comprising at least one LED of claim 6.

16. The backlight module of claim 15, wherein the backlight module comprises at least two light guide mechanisms, the at least one LED is disposed between side faces of any two adjacent light guide mechanisms, and two light-exiting windows from the light-exiting windows of each LED correspond to the side faces of the two adjacent light guide mechanisms, respectively.

17. The LED support of claim 1, wherein a recess is provided in the housing, the recess being configured to support a barrier sheet used in pouring sealant and disposed near the mounting face, and being configured to be recessed on the bottom surface of the housing without passing through the housing.

* * * * *